(12) United States Patent
Goishi et al.

(10) Patent No.: US 8,418,011 B2
(45) Date of Patent: Apr. 9, 2013

(54) TEST MODULE AND TEST METHOD

(75) Inventors: Masaru Goishi, Saitama (JP); Tokunori Akita, Saitama (JP)

(73) Assignee: Advantest Corporation, Tokyo (JP)

( * ) Notice: Subject to any disclaimer, the term of this patent is extended or adjusted under 35 U.S.C. 154(b) by 77 days.

(21) Appl. No.: 13/035,835

(22) Filed: Feb. 25, 2011

(65) Prior Publication Data

US 2011/0276830 A1 Nov. 10, 2011

Related U.S. Application Data

(63) Continuation of application No. PCT/JP2009/004491, filed on Sep. 10, 2009.

(30) Foreign Application Priority Data

Sep. 12, 2008 (JP) ................................. 2008-235491

(51) Int. Cl.
*G01R 31/28* (2006.01)
*G06F 7/58* (2006.01)

(52) U.S. Cl.
USPC ............................ 714/738; 714/736; 708/250

(58) Field of Classification Search .................. 714/724, 714/726, 728, 736, 738, 739; 708/250, 252, 708/254
See application file for complete search history.

(56) References Cited

U.S. PATENT DOCUMENTS

| | | | | |
|---|---|---|---|---|
| 5,258,936 A | * | 11/1993 | Gallup et al. | 708/254 |
| 5,383,143 A | * | 1/1995 | Crouch et al. | 708/254 |
| 5,434,807 A | | 7/1995 | Yoshida | |
| 5,444,645 A | | 8/1995 | Yoshida et al. | |
| 5,446,683 A | | 8/1995 | Mullen et al. | |
| 5,574,733 A | * | 11/1996 | Kim | 714/728 |
| 6,415,409 B1 | * | 7/2002 | Rhodes et al. | 714/738 |
| 7,093,175 B2 | * | 8/2006 | Rajski et al. | 714/728 |
| 7,840,865 B2 | * | 11/2010 | Lai et al. | 714/728 |
| 2006/0190794 A1 | | 8/2006 | Murata | |

FOREIGN PATENT DOCUMENTS

| | | |
|---|---|---|
| EP | 0620518 A1 | 10/1994 |
| JP | 62-263475 A | 11/1987 |
| JP | H6-21781 A | 1/1994 |
| JP | H6-291619 A | 10/1994 |

(Continued)

OTHER PUBLICATIONS

Hellebrand, S.; Rajski, J.; Tarnick, S.; Venkataraman, S.; Courtois, B.; , "Built-in test for circuits with scan based on reseeding of multiple-polynomial linear feedback shift registers," Computers, IEEE Transactions on , vol. 44, No. 2, pp. 223-233, Feb. 1995.*

(Continued)

*Primary Examiner* — Cynthia Britt

(57) ABSTRACT

There is provided a test module comprising a random number generator that generates a pseudo random pattern and includes a controller that generates a register selection signal based on a control instruction stored on an instruction memory, a plurality of polynomial configuration registers one of which is selected by the register selection signal, each polynomial configuration register having polynomial data stored therein, a plurality of initial value configuration registers one of which is selected by the register selection signal, each initial value configuration register having an initial value stored therein, and a random number generation shift register that loads the initial value from the selected one of the plurality of initial value configuration registers and sequentially generates the pseudo random pattern based on the polynomial data stored in the selected one of the plurality of polynomial configuration registers.

9 Claims, 5 Drawing Sheets

FOREIGN PATENT DOCUMENTS

| | | |
|---|---|---|
| JP | 7-72222 A | 3/1995 |
| JP | 10-91469 A | 4/1998 |
| KR | 10-2003-0082410 A | 10/2003 |
| KR | 10-2007-0051618 A | 5/2007 |

OTHER PUBLICATIONS

Hellebrand, S.; Reeb, B.; Tarnick, S.; Wunderlich, H.-J.; , "Pattern generation for a deterministic BIST scheme," Computer-Aided Design, 1995. ICCAD-95. Digest of Technical Papers., 1995 IEEE/ACM International Conference on , vol., No., pp. 88-94, Nov. 5-9, 1995.*

Hong-Sik Kim; Sungho Kang; , "Increasing encoding efficiency of LFSR reseeding-based test compression," Computer-Aided Design of Integrated Circuits and Systems, IEEE Transactions on , vol. 25, No. 5, pp. 913- 917, May 2006.*

Darus, Z.M.; Ahmed, I.; Ali, L.; , "A test processor chip implementing multiple seed, multiple polynomial linear feedback shift register," Test Symposium, 1997. (ATS '97) Proceedings., Sixth Asian , vol., No., pp. 155-160, Nov. 17-19, 1997 doi: 10.1109/ATS.1997.643952.*

International Search Report (ISR) issued in PCT/JP2009/004491 (parent application) mailed in Dec. 2009 for Examiner consideration.

Written Opinion (PCT/ISA/237) issued in PCT/JP2009/004491 (parent application) mailed in Dec. 2009.

Korean Office Action dated Apr. 27, 2012, in a counterpart Korean patent application No. 10-2011-7003934.

JP Office Action and Machine Translation Dated Dec. 4, 2012; Application No. 2010-528643.

* cited by examiner

TEST MODULE AND TEST METHOD

BACKGROUND

1. Technical Field

The present invention relates to a test module and a test method. More specifically, the present invention relates to a test module and a test method that can dynamically generate a pseudo random pattern in response to a control instruction.

2. Related Art

For example, Japanese Patent Application Publication Nos. 06-021781 and 06-291619 disclose a pattern generator that generates pseudo random patterns in parallel or multiple channels. Generally speaking, a circuit constituted by an n-bit random number generation shift register and an exclusive OR (EOR) is used to generate a pseudo random bit sequence with a cycle of $2^n-1$ by taking bits indicated by an n-th-order primitive polynomial, calculating an EOR logical operation of the bits, and shifting-in the result of the EOR logical operation into the random number generation shift register.

Here, the primitive polynomial is configured by the value of a polynomial configuration register, and the random number generation shift register receives as the initial value the value of an initial value configuration register and starts the shifting on reception of the initial value.

However, the value of the polynomial configuration register or the value of the initial value configuration register cannot be dynamically changed by, for example, a control instruction. A test apparatus may employ a pseudo random pattern as a test pattern. Such a test apparatus may desire to configure the initial value to a specific value or generate the pseudo random pattern reflecting test results. These demands are preferably fulfilled.

SUMMARY

Therefore, it is an object of an aspect of the innovations herein to provide a test module and a test method, which are capable of overcoming the above drawbacks accompanying the related art. The above and other objects can be achieved by combinations described in the claims.

An aspect of the innovations may include an exemplary test module for testing a device under test includes a pattern memory that has a test pattern stored therein, a random number generator that generates a pseudo random pattern, a pattern selector that selects one of the test pattern and the pseudo random pattern as a driver pattern, and a waveform generator that generates, based on the driver pattern, a waveform of a signal to be supplied to the device under test. Here, the random number generator includes a controller that generates a register selection signal based on a control instruction stored on an instruction memory, a plurality of polynomial configuration registers one of which is selected by the register selection signal, each polynomial configuration register having polynomial data stored therein, a plurality of initial value configuration registers one of which is selected by the register selection signal, each initial value configuration register having an initial value stored therein, and a random number generation shift register that loads the initial value from the selected one of the plurality of initial value configuration registers and sequentially generates the pseudo random pattern based on the polynomial data stored in the selected one of the plurality of polynomial configuration registers.

The pattern memory may further have an expected value pattern corresponding to the test pattern stored therein, the pattern selector may further select one of the expected value pattern and the pseudo random pattern as a comparison pattern, and the test module may further comprise a comparator that compares an output pattern from the device under test against the comparison pattern. Based on the control instruction, the controller may further generate a start signal to start an operation of the random number generation shift register and a suspend signal to suspend the operation of the random number generation shift register. Based on the control instruction, the controller may further generate a resume signal to resume the suspended operation of the random number generation shift register, and, on reception of the resume signal, the random number generation shift register can resume the operation from a step subsequent to a step suspended in response to the suspend signal. The random number generator may further include an acquisition shift register that sequentially stores therein a value obtained from an output from the device under test, and, based on the control instruction, the controller can generate an acquisition signal to load the value stored in the acquisition shift register onto the random number generation shift register as an initial value and to start the operation of the random number generation shift register.

The controller can generate a pattern selection signal to cause the pattern selector to select one of the pseudo random pattern, the pattern stored in the pattern memory, and a combination thereof. The pattern selector may include a table that designates the combination of the pseudo random pattern and the pattern stored in the pattern memory. The controller may include an instruction table to specify how to control the random number generator differently in connection with each of channels corresponding to test terminals of the device under test.

An aspect of the innovations may include an exemplary test method for testing a device under test includes storing a test pattern onto a pattern memory, generating a pseudo random pattern, selecting one of the test pattern and the pseudo random pattern as a driver pattern, and generating a waveform of a signal to be supplied to the device under test based on the driver pattern. Here, the generating a pseudo random pattern includes generating a register selection signal based on a control instruction stored in an instruction memory, selecting one of a plurality of polynomial configuration registers each of which has polynomial data stored therein, in accordance with designation made by the register selection signal, selecting one of a plurality of initial value configuration registers each of which has an initial value stored therein, in accordance with designation made by the register selection signal, and loading the initial value from the selected one of the plurality of initial value configuration registers and sequentially generating the pseudo random pattern based on the polynomial data stored in the selected one of the plurality of polynomial configuration registers.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
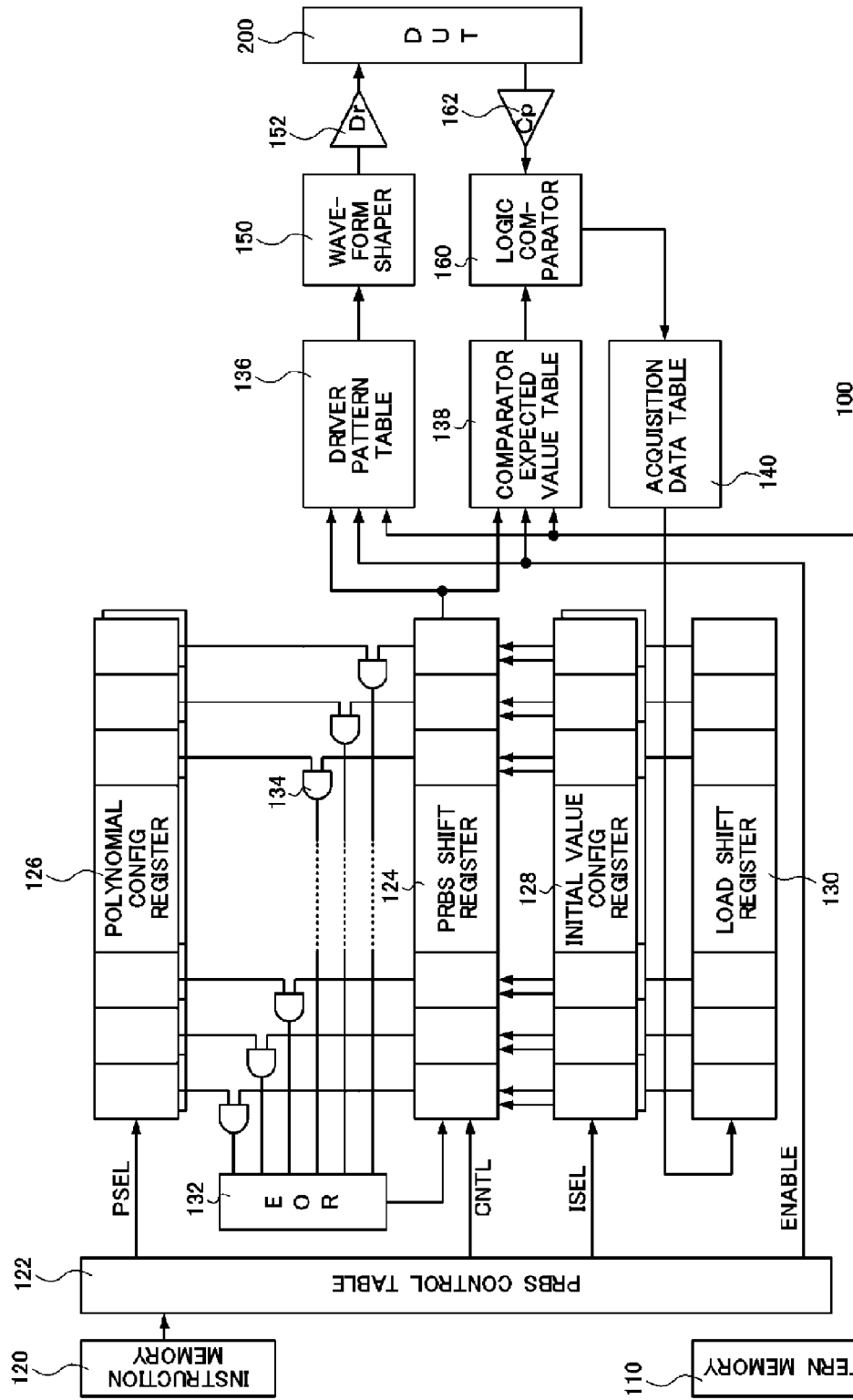
FIG. 1 illustrates an example of a test module 100 relating to an embodiment of the present invention, together with a device under test 200.

FIG. 1 illustrates an example of a test module 100 relating to an embodiment of the present invention, together with a device under test (DUT) 200. The test module 100 relating to the present embodiment is designed to test the device under test 200. The test module 100 includes a pattern memory 110, an instruction memory 120, a PRBS control table 122, a PRBS shift register 124, polynomial configuration registers 126, initial value configuration registers 128, a LOAD shift register 130, an EOR circuit 132, AND circuits 134, a driver pattern table 136, a comparator expected value table 138, an acquisition data table 140, a waveform shaper 150, a driver 152, a logic comparator 160, and a comparator 162.

The pattern memory 110 has a test pattern stored therein. The pattern memory 110 outputs the stored test pattern to the driver pattern table 136. The pattern memory 110 may also has an expected value pattern corresponding to the test pattern stored therein, in addition to the test pattern. The pattern memory 110 outputs the stored expected value pattern to the comparator expected value table 138. The instruction memory 120 has a control instruction stored therein to control the PRBS shift register 124, the polynomial configuration registers 126, or the initial value configuration registers 128.

The PRBS control table 122 may be an exemplary controller. The PRBS control table 122 generates a register selection signal based on the control instruction stored in the instruction memory 120. Based on the control instruction, the PRBS control table 122 may generate a start signal to start the operation of the PRBS shift register 124 and a suspend signal to suspend the operation of the PRBS shift register 124. Based on the control instruction, the PRBS control table 122 may generate a resume signal to resume the suspended operation of the PRBS shift register 124.

Based on the control instruction, the PRBS control table 122 may generate an acquisition signal to load the value stored in the LOAD shift register 130 onto the PRBS shift register 124 as the initial value and start the operation of the PRBS shift register 124. The PRBS control table 122 may generate a pattern selection signal to enable the driver pattern table 136 or the comparator expected value table 138 to select one of a pseudo random pattern, the pattern stored in the pattern memory 110 or a combination thereof. The PRBS control table 122 may include an instruction table to specify how to control the random number generator differently in connection with each of the channels corresponding to the test terminals of the device under test 200.

The PRBS shift register 124 loads the initial value from a selected one of the initial value configuration registers 128 thereonto and sequentially generates a pseudo random pattern based on the polynomial data stored in a selected one of the polynomial configuration registers 126. The PRBS shift register 124 may be an exemplary random number generation shift register. The PRBS shift register 124 can resume its operation from a step subsequent to a step suspended in response to the suspend signal, on reception of the resume signal.

The polynomial configuration registers 126, one of which is selected by the register selection signal, each has polynomial data stored therein. The initial value configuration registers 128, one of which is selected by the register selection signal, each has an initial value stored therein. The LOAD shift register 130 is configured to sequentially store therein the values obtained from the output from the device under test 200. The LOAD shift register 130 may be an exemplary acquisition random number generation shift register.

The EOR circuit 132 and the AND circuits 134 generate pseudo random numbers from the values of the PRBS shift register 124 and the polynomial configuration registers 126. Each AND circuit 134 calculates a logical AND between the value of a corresponding one of the polynomial configuration registers 126 and a corresponding value of the PRBS shift register 124, and the EOR circuit 132 calculates an exclusive logical OR between the outputs of the AND circuit 134 and shifts-in the result into the PRBS shift register 124. The EOR circuit 132 and the AND circuits 134 may constitute an exemplary random number generator that generates a pseudo random pattern.

The driver pattern table 136 selects one of the test pattern and the pseudo random pattern as a driver pattern. The driver pattern table 136 may be an exemplary pattern selector. The comparator expected value table 138 selects one of the expected value pattern and the pseudo random pattern as a comparison pattern. The comparator expected value table 138 may be an exemplary pattern selector. The driver pattern table 136 or the comparator expected value table 138 may include a table that specifies a combination of the pseudo random pattern and the pattern stored in the pattern memory 110, i.e., the test pattern or the expected value pattern.

The acquisition data table 140 is configured to store therein the result of the comparison done by the logic comparator 160, which is to be loaded onto the LOAD shift register 130. The waveform shaper 150 generates a waveform of the signal to be supplied to the device under test 200, based on the driver pattern. The waveform shaper 150 may be an exemplary waveform generator. The driver 152 drives the signal to be supplied to the device under test 200. The comparator 162 senses the output from the device under test 200. The logic comparator 160 compares the output pattern from the device under test against the comparison pattern. The logic comparator 160 may be an exemplary comparator.

Figure 2:
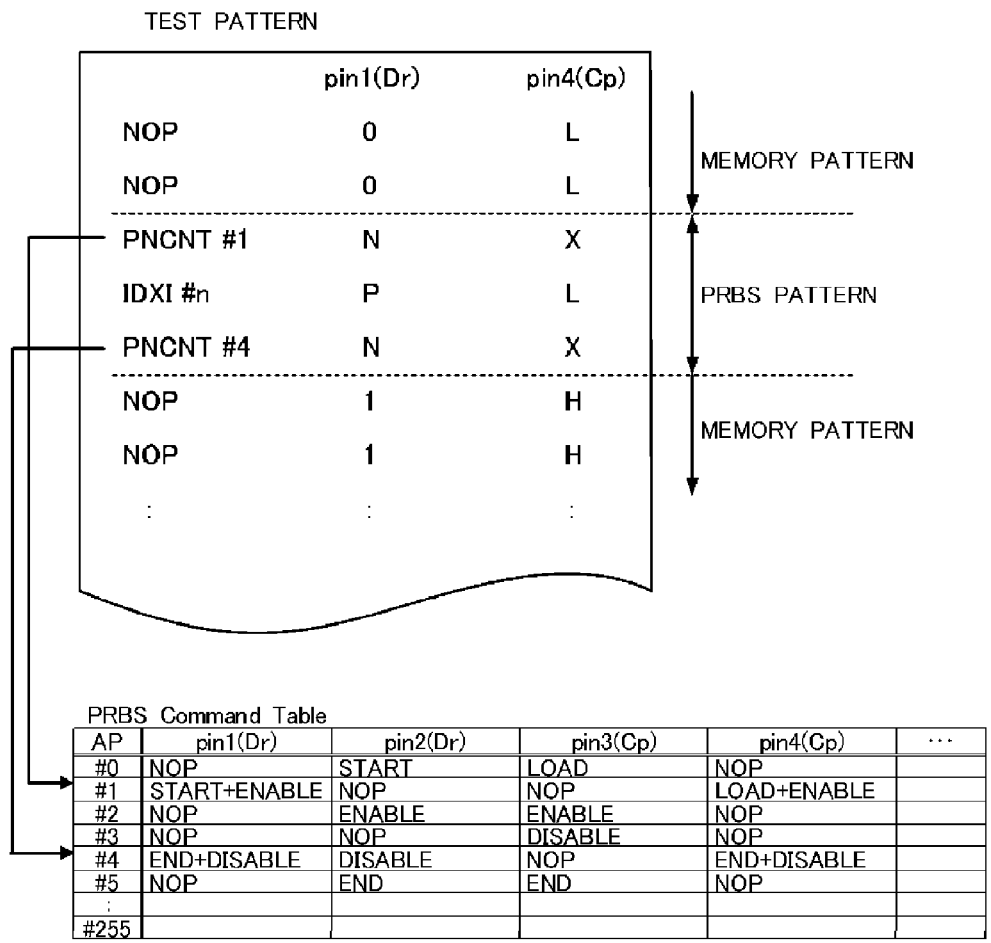
FIG. 2 illustrates an exemplary test pattern and an exemplary PRBS command table.

FIG. 2 illustrates an exemplary test pattern and an exemplary PRBS command table. The test pattern includes a memory pattern stored in the pattern memory 110 and a PRBS pattern to generate the pseudo random pattern. In the test pattern, the left column represents commands, and the middle and right columns respectively represent operands for pins 1 and 4. Here, it should be noted that the pin 1 is a driver channel, and the pin 4 is a comparator channel. The operands for the driver channel represent the test pattern, and the operands for the comparator channel represent the expected value pattern.

The PRBS command table has commands stored therein in association with combinations of address pointers AP and channels (pins). The address pointer AP is designated by a PNCNT command included in the PRBS pattern, and the PRBS commands recorded on the designated address pointer are executed for the respective channels (pins). The following describes representative PRBS commands.

A START command is to load the initial value selected by the operand onto the PRBS shift register 124 and to start the operation of the PRBS shift register 124 in accordance with the polynomial configured by the polynomial configuration register 126. A LOAD command is to load the value of the acquisition data table 140 onto the PRBS shift register 124 and to start the operation of the PRBS shift register 124 in accordance with the polynomial configured by the polynomial configuration register 126. An END command is to maintain a final PRBS pattern and to suspend the operation of the PRBS shift register 124. A CONTINUE command is to resume the operation of the PRBS shift register 124 from a cycle subsequent to the cycle of the PRBS pattern maintained in response to the END command.

An ENABLE command is to control the driver pattern table 136 or the comparator expected value table 138 to select the PRBS pattern from among one of the test and expected value patterns and the PRBS pattern. A DISABLE command is to control the driver pattern table 136 or the comparator expected value table 138 to select the memory pattern stored in the pattern memory 110, that is to say, the test pattern or the expected value pattern, from among one of the test and expected value patterns and the PRBS pattern. A NOP command is no operation.

Figure 3:
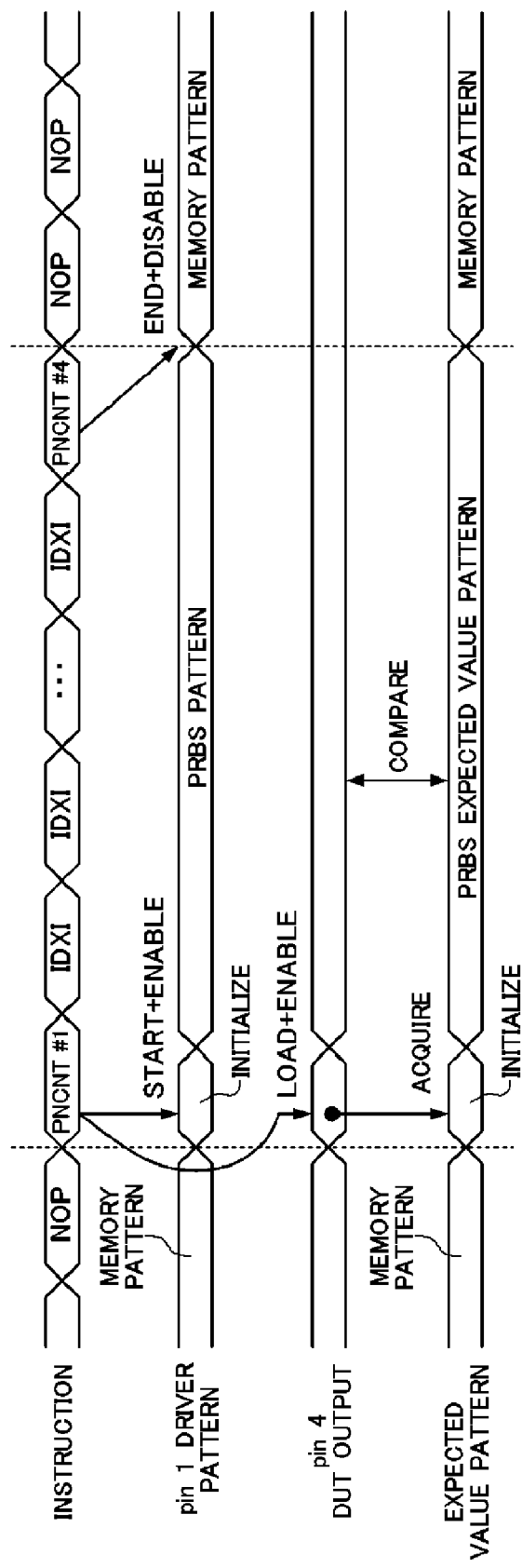
FIG. 3 illustrates how a pin 1 and a pin 4 operate when the test pattern and PRBS command table shown in FIG. 2 are used.

FIG. 3 illustrates how the pins 1 and 4 operate when the test pattern and PRBS command table shown in FIG. 2 are used. The commands in the test pattern are sequentially processed. In response to the start of the processing of the PRBS pattern, a PNCNT #1 command is first executed. In accordance with this command, an address #1 of the PRBS command table is referred to, as a result of which "START+ENABLE" is executed on the pin 1 and "LOAD+ENABLE" is executed on the pin 4.

The execution of "START+ENABLE" on the pin 1 starts at the timing when the PNCNT #1 command is executed. The execution of the START command results in the PRBS shift register 124 corresponding to the pin 1 generating a PRBS pattern after initialization such as loading of an initial value. Since the ENABLE command is also executed in addition to the START command, the driver 152 corresponding to the pin 1 receives the PRBS pattern.

At the same time, "LOAD+ENABLE" is executed on the pin 4. As a result, the LOAD shift register 130 corresponding to the pin 4 acquires the DUT output via the acquisition data table 140. The value of the LOAD shift register 130 is loaded to initialize the PRBS shift register 124, and the PRBS shift register 124 corresponding to the pin 4 generates a PRBS expected value pattern. Since the ENABLE command is executed in addition to the LOAD command, the logic comparator 160 corresponding to the pin 4 receives the PRBS expected value pattern. The DUT output is then compared against the PRBS expected value pattern.

After the above procedure is executed the number of times designated by an IDXI command, a PNCNT#4 command in the test pattern is executed. In accordance with this command, an address #4 of the PRBS command table is referred to, as a result of which "END+DISABLE" is executed on the pins 1 and 4. The execution of the END command results in the suspension of the oration of the PRBS shift register 124, and the execution of the DISABLE command results in selecting the memory pattern.

Figure 4:
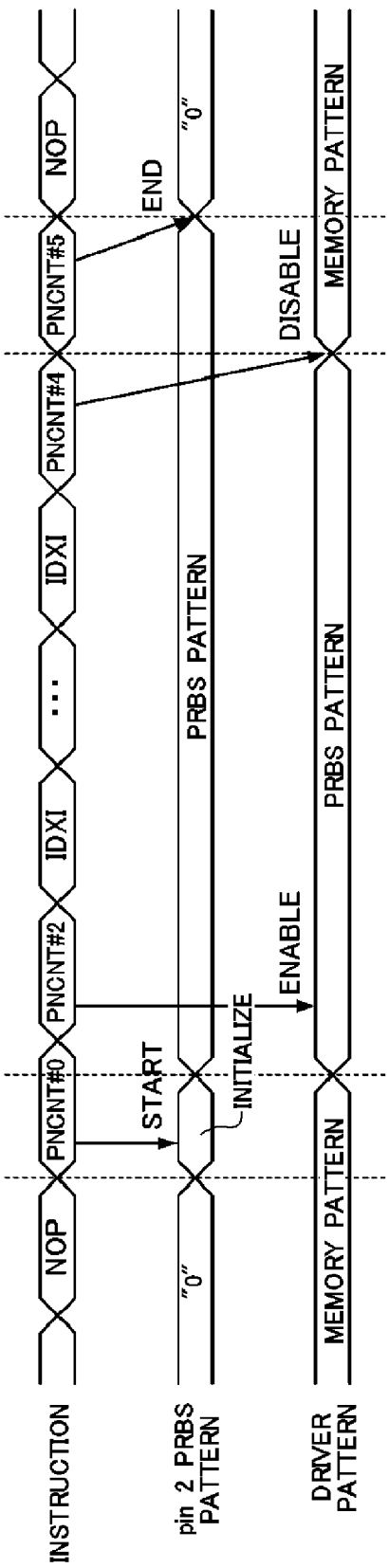
FIG. 4 illustrates how a pin 2 operates when the PRBS command table shown in FIG. 2 is used.

FIG. 4 illustrates how a pin 2 operates when the PRBS command table shown in FIG. 2 is used. When a PNCNT#0 command is executed, an address #0 of the PRBS command table is referred to, as a result of which a START command is executed. Thus, the PRBS shift register 124 corresponding to the pin 2 starts operating after initialization to start generating a PRBS pattern. At this stage, an ENABLE command has not yet been executed. Therefore, the PRBS pattern is not output to the driver and the memory pattern is output as the driver pattern.

As the processing of the test pattern proceeds, a PNCNT#2 command is executed. In response to the execution of the PNCNT#2 command, the PRBS command table is referred to and an ENABLE command is executed. As a result, the PRBS pattern is output as the driver pattern. After the above procedure is executed the number of times designated by an IDXI command, an PNCNT#4 command is executed. In response to the execution of the PNCNT#4 command, the PRBS command table is referred to, and a DISABLE command is executed. As a result, the pattern supplied to the driver is switched from the PRBS pattern to the memory pattern, and the driver accordingly outputs the memory pattern. Furthermore, when a PNCNT#5 is executed and an END command is accordingly executed, the PRBS shift register 124 corresponding to the pin 2 is suspended from operating.

Figure 5:
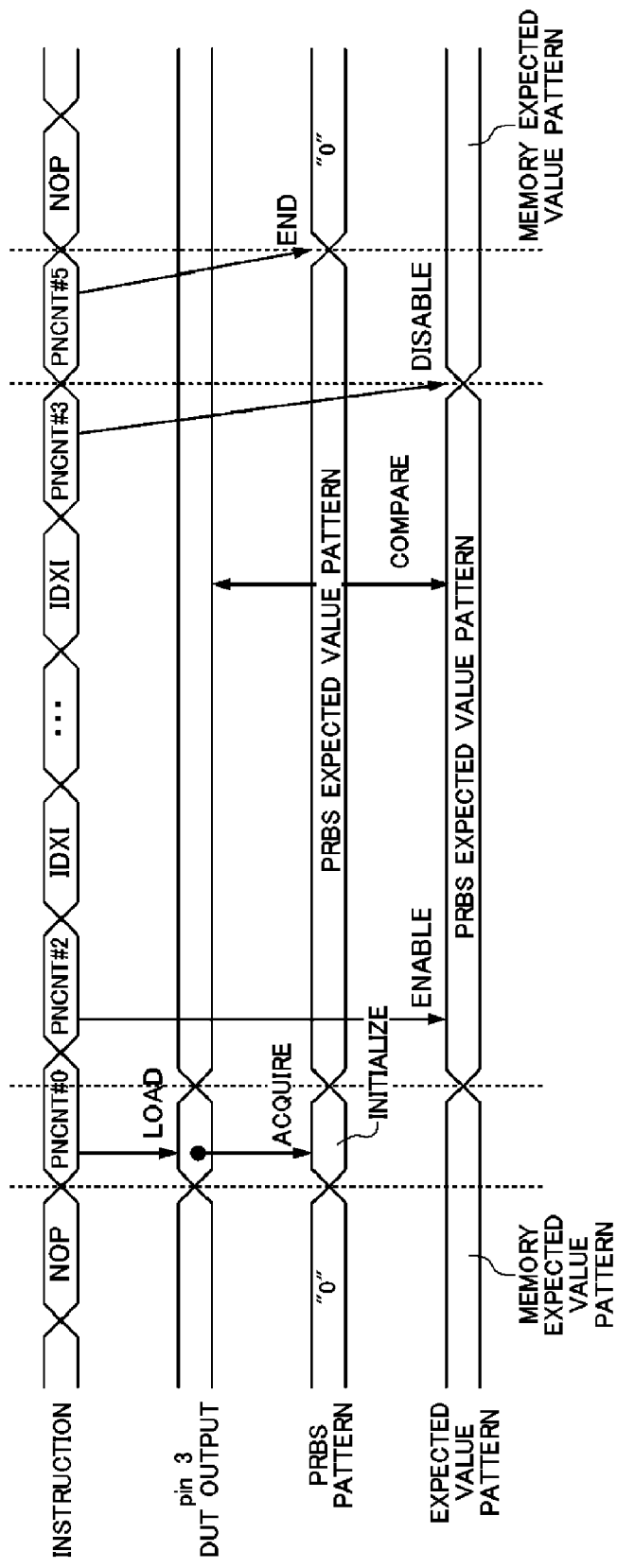
FIG. 5 illustrates how a pin 3 operates when the PRBS command table shown in FIG. 2 is used.

FIG. 5 illustrates how a pin 3 operates when the PRBS command table shown in FIG. 2 is used. When a PNCNT#0 command is executed, an address #0 of the PRBS command table is referred to, as a result of which a LOAD command is executed. Thus, the PRBS shift register 124 corresponding to the pin 3 starts operating after initialization that acquires the DUT output of the pin 3. Accordingly, the PRBS shift register 124 corresponding to the pin 3 starts generating a PRBS expected value pattern. At this stage, an ENABLE command has not yet been executed. Therefore, the PRBS expected value pattern is not output to the logic comparator 160 and the memory expected value pattern is output as the expected value pattern.

As the processing of the test pattern proceeds, a PNCNT#2 command is executed. In response to the execution of the PNCNT#2 command, the PRBS command table is referred to and an ENABLE command is executed. As a result, the PRBS expected value pattern is output as the expected value pattern. After the above procedure is executed the number of times designated by an IDXI command, a PNCNT#3 command is executed. In response to the execution of the PNCNT#3 command, the PRBS command table is referred to, and a DISABLE command is executed. As a result, the expected value pattern supplied to the logic comparator 160 is switched from the PRBS expected value pattern to the memory expected value pattern, and the memory expected value pattern is supplied as the expected value pattern. Furthermore, when a PNCNT#5 is executed and an END command is accordingly executed, the PRBS shift register 124 corresponding to the pin 3 is suspended from operating.

According to the above-described embodiment, pattern instructions can be utilized to control a variety of registers that generate pseudo random patterns. Accordingly, a test apparatus can conduct tests using pseudo random pattern generated in accordance with the purposes of testing devices under test. For example, a pseudo random pattern may be generated by using, as an initial value, a specific pattern such as a pattern output from a device under test, and the generated pseudo random pattern can be used as a test pattern to test the device under test.

While the embodiment(s) of the present invention has (have) been described, the technical scope of the invention is not limited to the above described embodiment(s). It is apparent to persons skilled in the art that various alterations and improvements can be added to the above-described embodiment(s). It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, specification, or drawings, it does not necessarily mean that the process must be performed in this order.

DESCRIPTION OF REFERENCE NUMERALS 100 test module
110 pattern memory
120 instruction memory
122 PRBS control table
124 PRBS shift register
126 polynomial configuration register
128 initial value configuration register
130 LOAD shift register
132 EOR circuit
134 AND circuit
136 driver pattern table
138 comparator expected value table
140 acquisition data table
150 waveform shaper
152 driver
160 logic comparator
162 comparator
200 device under test

What is claimed is:

1. A test module for testing, a device wider test, comprising:
a pattern memory that has an externally supplied deterministic test pattern stored therein;
a random number generator that generates a pseudo random pattern;
a pattern selector that selects one of the deterministic test pattern stored in the pattern memory and the pseudo random pattern as a driver pattern; and
a waveform generator that generates, based on the driver pattern, a waveform of a signal to be supplied to the device under test, wherein
the random number generator includes:
a controller that generates a register selection signal based on a control instruction stored on an instruction memory;
a plurality of polynomial configuration registers one of which is selected by the register selection signal, each polynomial configuration register having polynomial data stored therein;
a plurality of initial value configuration registers one of which is selected by the register selection signal, each initial value configuration register having an initial value stored therein; and
a random number veneration shift register that loads the initial value from the selected one of the plurality of initial value configuration registers and sequentially generates the pseudo random pattern based on the polynomial data stored in the selected one of the plurality of polynomial configuration registers.

2. The test module as set forth in claim 1, wherein
the pattern memory further has an expected value pattern corresponding to the test pattern stored therein,
the pattern selector further selects one of the expected value pattern and the pseudo random pattern as a comparison pattern, and the test module further comprises a comparator that compares an output pattern from the device under test against the comparison pattern.

3. The test module as set forth in claim 2, wherein
based on the control instruction, the controller further generates a start signal to start an operation of the random number generation shift register and a suspend signal to suspend the operation of the random number generation shift register.

4. The test module as set forth in claim 3, wherein
based on the control instruction, the controller further generates a resume signal to resume the suspended operation of the random number generation shift register, and
on reception of the resume signal, the random number generation shift register resumes the operation from a step subsequent to a step suspended in response to the suspend signal.

5. The test module as set forth in claim 4, wherein
the random number generator further includes an acquisition shift register that sequentially stores therein a value obtained from an output from the device under test, and
based on the control instruction, the controller generates an acquisition signal to load the value stored in the acquisition shift register onto the random number generation shift register as an initial value and to start the operation of the random number generation shift register.

6. The test module as set forth in claim 5, wherein
the controller generates a pattern selection signal to cause the pattern selector to select one of the pseudo random pattern, the pattern stored in the pattern memory, and a combination thereof.

7. The test module as set forth in claim 6, wherein
the pattern selector includes a table that designates the combination of the pseudo random pattern and the pattern stored in the pattern memory.

8. The test module as set forth in claim 7, wherein
the controller includes an instruction table to specify how to control the random number generator differently in connection with each of channels corresponding to test terminals of the device under test.

9. A test method for testing a device under test, comprising:
storing an externally supplied deterministic test pattern onto a pattern memory;
generating a pseudo random pattern;
selecting one of the stored deterministic test pattern and the pseudo random pattern as a driver pattern; and
generating a waveform of a signal to be supplied to the device under test based on the driver pattern, wherein
the generating a pseudo random pattern includes:
generating a register selection signal based on a control instruction stored in an instruction memory;
selecting one of a plurality of polynomial configuration registers each of which has polynomial data stored therein, in accordance with designation made by the register selection signal;
selecting one of a plurality of initial value configuration registers each of which has an initial value stored therein, in accordance with designation made by the register selection signal; and
loading the initial value from the selected one of the plurality of initial value configuration registers and sequentially generating the pseudo random pattern based on the polynomial data stored in the selected one of the plurality of polynomial configuration registers.

* * * * *